United States Patent
Oliaei et al.

(10) Patent No.: US 12,199,629 B2
(45) Date of Patent: Jan. 14, 2025

(54) CLOCKING SCHEME FOR REDUCED NOISE IN CONTINUOUS-TIME SIGMA-DELTA ADCS PRELIMINARY CLASS

(71) Applicant: InvenSense, Inc., San Jose, CA (US)

(72) Inventors: Omid Oliaei, Sunnyvale, CA (US); Aurelio Pellegrini, Sestola (IT); Daniele Ottini, Pavia (IT)

(73) Assignee: InvenSense, Inc., San Jose, CA (US)

( * ) Notice: Subject to any disclaimer, the term of this patent is extended or adjusted under 35 U.S.C. 154(b) by 183 days.

(21) Appl. No.: 18/107,219

(22) Filed: Feb. 8, 2023

(65) Prior Publication Data

US 2024/0267055 A1   Aug. 8, 2024

(51) Int. Cl.
*H03M 1/10* (2006.01)
*H03M 3/00* (2006.01)
*H03K 19/20* (2006.01)

(52) U.S. Cl.
CPC ......... *H03M 1/1071* (2013.01); *H03M 3/458* (2013.01); *H03K 19/20* (2013.01)

(58) Field of Classification Search
CPC .. H03M 1/1071; H03M 3/458; H03M 1/1245; H03K 19/20; H03K 3/023; H03H 7/30
USPC ................................ 341/120, 118, 155, 144
See application file for complete search history.

(56) References Cited

U.S. PATENT DOCUMENTS

| | | | |
|---|---|---|---|
| 9,252,707 B2 | 2/2016 | Seth et al. | |
| 10,123,103 B1 | 11/2018 | Buffa et al. | |
| 11,054,328 B2 | 7/2021 | Srinivasan et al. | |
| 11,683,624 B1 | 6/2023 | Aschieri | |
| 2008/0069196 A1* | 3/2008 | Choi | H04L 25/03885 375/231 |
| 2010/0283552 A1* | 11/2010 | Colin | H03B 5/20 331/143 |
| 2022/0057207 A1 | 2/2022 | Pinna et al. | |
| 2023/0146711 A1 | 5/2023 | Peng et al. | |
| 2024/0072820 A1* | 2/2024 | Nurani | H03M 1/502 |

* cited by examiner

*Primary Examiner* — Peguy Jean Pierre
(74) *Attorney, Agent, or Firm* — Van Hoven PC; Joshua Van Hoven; Stefan D. Osterbur (57) ABSTRACT

A circuit for a feedback system incorporates a gating mechanism to reduce flicker noise (e.g., a source for bias instability within a MEMS device) at a digital output. The gating mechanism generates a gating pulse with a delay period (e.g., a common, or fixed, delay including symmetrical rising and falling edge delays) that overrides internal delays (e.g., asymmetrical rising and falling edge delays) of a phase generator to prevent propagation delay (e.g., delay affected by jitter) from reaching subsequent feedback components (e.g., a digital-to-analog converter (DAC)) and contributing to the generation of flicker noise within the system.

20 Claims, 10 Drawing Sheets

Receive, from a phase generator, a signal and an inverted signal, wherein transitions of the signal and the inverted signal are misaligned based on respective delays affected by variable jitter

804

Override the transitions of the signal and the inverted signal to eliminate the delay mismatch between the respective delays

CLOCKING SCHEME FOR REDUCED NOISE IN CONTINUOUS-TIME SIGMA-DELTA ADCS PRELIMINARY CLASS

BACKGROUND

Numerous items such as smart phones, smart watches, tablets, automobiles, aerial drones, appliances, aircraft, exercise aids, and game controllers may utilize sensors such as microelectromechanical system (MEMS) sensors during their operation. In many applications, various types of motion sensors such as accelerometers and gyroscopes may be analyzed independently or together in order to determine varied information for particular applications. For example, gyroscopes and accelerometers may be used in gaming applications (e.g., smart phones or game controllers) to capture complex movements by a user, drones and other aircraft may determine orientation based on gyroscope measurements (e.g., roll, pitch, and yaw), and vehicles may utilize measurements for determining direction (e.g., for dead reckoning) and safety (e.g., to recognizing skid or roll-over conditions).

Allan variance (AVAR) measures frequency stability when no input is applied to a sensor such as a MEMS sensor. For example, under normal conditions, a MEMS sensor may measure an angular velocity and integrate the angular velocity over time to determine an angle. If the MEMS sensor is not rotated, the angular velocity should remain stable. In some embodiments, however, an angle rate variance when a MEMS sensor is not rotated may be apparent. Since a MEMS sensor integrates over time, an extended MEMS operation may result in greater degrees of uncertainty. If the source of the variance is flicker noise generated by an internal component of the MEMS sensor (e.g., an analog-to-digital converter (ADC) propagation delay), the angle rate variance increases as a function of time (e.g., as opposed to thermal noise being the source of the variance, in which case the variance increases as a function of square root of time). In some embodiments, flicker noise may be the dominant source of bias instability within a MEMS device.

SUMMARY

In an embodiment of the present disclosure, a circuit for reducing flicker noise in a sensor signal path comprises a comparison block coupled to receive a first signal within the sensor signal path and to change an output state of a comparison block output signal based on whether the first signal is transitioning between a first value and a second value. The circuit may further comprise a gating pulse generator coupled to receive the comparison block output signal, where a gating pulse having a delay period is output from the gating pulse generator when the output state of the comparison block output signal changes. The circuit may comprise a gating stage, where a second signal is an inverted version of the first signal, and where the gating stage receives the gating pulse, a third signal that is based on the first signal, and a fourth signal that is based on the second signal. A transition of the third signal from a third value to a fourth value and a transition of the fourth signal from a fifth value to a sixth value may be delayed based on the delay period of the gating pulse. In some embodiments, each of the first value, the second value, the third value, the fourth value, the fifth value, and the sixth value may be a binary value.

In an embodiment of the present disclosure, a method for reducing delay mismatch owing to jitter comprises receiving, from a phase generator, a signal and an inverted signal, where transitions of the signal and the inverted signal are misaligned based on respective delays affected by jitter. The method may further comprise overriding the transitions of the signal and the inverted signal to eliminate the delay mismatch between the respective delays.

BRIEF DESCRIPTION OF DRAWINGS

The above and other features of the present disclosure, its nature, and various advantages will be more apparent upon consideration of the following detailed description, taken in conjunction with the accompanying drawings in which.

DETAILED DESCRIPTION

The feedback signal of a continuous-time Sigma-Delta modulator may be a No-Return-to-Zero (NRZ) pulse. Any mismatch between rise and fall times of these pulses causes asymmetry between transitions from zero to one or from one to zero. A slow-varying noise, namely flicker noise, present in the switches and logic gates driving the switches, modulates the asymmetry and propagates to component outputs (e.g., an analog-to-digital converter of a signal path). The present disclosure eliminates such asymmetry in feedback signal transitions by gating the feedback pulses such as by utilizing a constant delay, such that the feedback pulses generated in both directions, low to high or high to low, exhibit the same pulse width. The components include logic gates that create a delay and other logic gates that implement the gating function.

Figure 1:
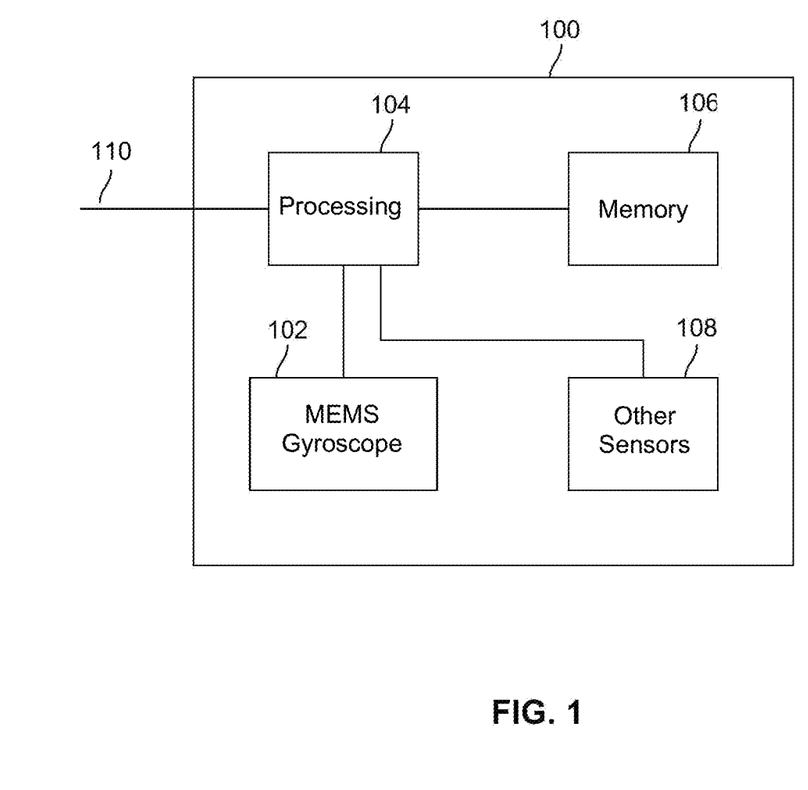
FIG. 1 shows an illustrative MEMS system in accordance with an embodiment of the present disclosure.

FIG. 1 shows an illustrative MEMS system 100 in accordance with an embodiment of the present disclosure. Although particular components are depicted in FIG. 1, it will be understood that other suitable combinations of the MEMS, processing components, memory, and other circuitry may be utilized as necessary for different applications and systems. In at least some embodiments, the circuitry, devices, systems, and methods described herein are described in the context of a system including processing circuitry configured to reduce bias instability of a sensor such as a MEMS device to a negligible level. More specifically, in at least some examples, the processing circuitry is configured to implement a gating mechanism within a feedback network, where the gating mechanism samples a quantizer, including a jitter, and overrides all the variously changing (e.g., random) delays due to jitter, e.g., with a fixed delay within the signal path to avoid the random delays from being reflected in a feedback signal sense path digital filter output. The gating mechanism includes a comparison block, which receives a bit stream signal and an inverted clock signal and outputs a comparison signal (e.g., pre_pulse). Based on the value of the comparison signal, a gating pulse generator either generates a gating pulse via a delay line, which overrides internal delays of a phase generator (e.g., corresponding to the quantizer propagation delay), or passes the comparison signal without delay. A gating stage is configured to receive an output of the phase generator, potentially including jitter applied to the bit stream signal, and the gating pulse from the gating pulse generator overrides the jitter. It will be understood that the circuitry, devices, systems, and methods described herein may be applied to other types of MEMS devices or sensors.

Processing circuitry 104 may include one or more components providing processing based on the requirements of the MEMS system 100. In some embodiments, processing circuitry 104 may include hardware control logic that may be integrated within a chip of a sensor (e.g., on a base substrate of a MEMS gyroscope 102 or other sensor 108, or on an adjacent portion of a chip to the MEMS gyroscope 102 or other sensor 108) to control the operation of the MEMS gyroscope 102 or other sensors 108 and perform aspects of processing for the MEMS gyroscope 102 or the other sensors 108. In some embodiments, the MEMS gyroscope 102 and other sensors 108 may include one or more registers that allow aspects of the operation of hardware control logic to be modified (e.g., by modifying a value of a register). In some embodiments, processing circuitry 104 may also include a processor such as a microprocessor that executes software instructions, e.g., that are stored in memory 106. The microprocessor may control the operation of the MEMS gyroscope 102 by interacting with the hardware control logic and processing signals received from MEMS gyroscope 102. The microprocessor may interact with other sensors 108 in a similar manner. In some embodiments, some or all of the functions of the processing circuitry 104, and in some embodiments, of memory 106, may be implemented on an application specific integrated circuit ("ASIC") and/or a field programmable gate array ("FPGA"). In some embodiments, MEMS gyroscope 102 may be referred to as a variety of MEMS sensors (e.g., an accelerometer, a barometer, an inertial measurement unit, a magnetometer, etc.).

Although in some embodiments (not depicted in FIG. 1), the MEMS gyroscope 102 or other sensors 108 may communicate directly with external circuitry (e.g., via a serial bus or direct connection to sensor outputs and control inputs), in an embodiment the processing circuitry 104 may process data received from the MEMS sensor 102 and other sensors 108 and communicate with external components via a communication interface 110 (e.g., a serial peripheral interface (SPI) or I2C bus, in automotive applications a controller area network (CAN) or Local Interconnect Network (LIN) bus, or in other applications a suitably wired or wireless communications interface as is known in the art).

The processing circuitry 104 may convert signals received from the MEMS gyroscope 102 and other sensors 108 into appropriate measurement units (e.g., based on settings provided by other computing units communicating over the communication interface 110) and perform more complex processing to determine measurements such as orientation or Euler angles, and in some embodiments, to determine from sensor data whether a particular activity (e.g., walking, running, braking, skidding, rolling, etc.) is taking place. In some embodiments, some or all of the conversions or calculations may take place on the hardware control logic or other on-chip processing of the MEMS gyroscope 102 or other sensors 108.

In some embodiments, certain types of information may be determined based on data from multiple MEMS gyroscopes 102 and other sensors 108 in a process that may be referred to as sensor fusion. By combining information from a variety of sensors it may be possible to accurately determine information that is useful in a variety of applications, such as image stabilization, navigation systems, automotive controls and safety, dead reckoning, remote control and gaming devices, activity sensors, 3-dimensional cameras, industrial automation, and numerous other applications.

In accordance with the present disclosure, a MEMS device (e.g., an accelerometer, a gyroscope, a barometer, a magnetometer, etc.) may experience variance in digital signal output (e.g., a source of bias instability within system 100) in response to noise (e.g., flicker, thermal, etc.) within or on the system. In some embodiments, flicker noise (e.g., a misalignment of transition times) by an internal component of the MEMS device (e.g., a phase generator of a sensor signal path) may cause, for example, a MEMS gyroscope to measure a variable angular velocity when the MEMS gyroscope is not being rotated and should be constant. The variable angular velocity is integrated over time by the MEMS device to determine an angle, so extended MEMS operation may result in greater degrees of uncertainty in the angle measurement. For example, bias instability may be measured in degrees of uncertainty per hour, for example, as a value of degrees of uncertainty per hour. In some embodiments, the source of the variance is flicker noise, in which case the output variance increases as a function of time. In some embodiments, the source of the variance is thermal noise, in which case the output variance increases as a function of square root of time. Flicker noise may dominate as the source of bias instability within the MEMS device, in which case degrees of uncertainty of the output signal may significantly increase as a function of time. It is desirable to limit the degrees of uncertainty of the MEMS device output signal to more accurately detect, e.g., angular velocity during rollover conditions of an automobile to properly deploy airbags and protect passengers.

In some embodiments, the MEMS device may be utilized as a navigation aid (e.g., for emergency brake, no cell coverage, etc.), in which case low bias instability (e.g., less than three degrees per hour or less than one degree per hour) would be desired. To achieve such a low bias instability, a gating mechanism may implement a transition gated delay to override variable delays caused by noise (e.g., flicker noise) generated by a sensor signal path such as within a phase generator the MEMS device.

Figure 2:
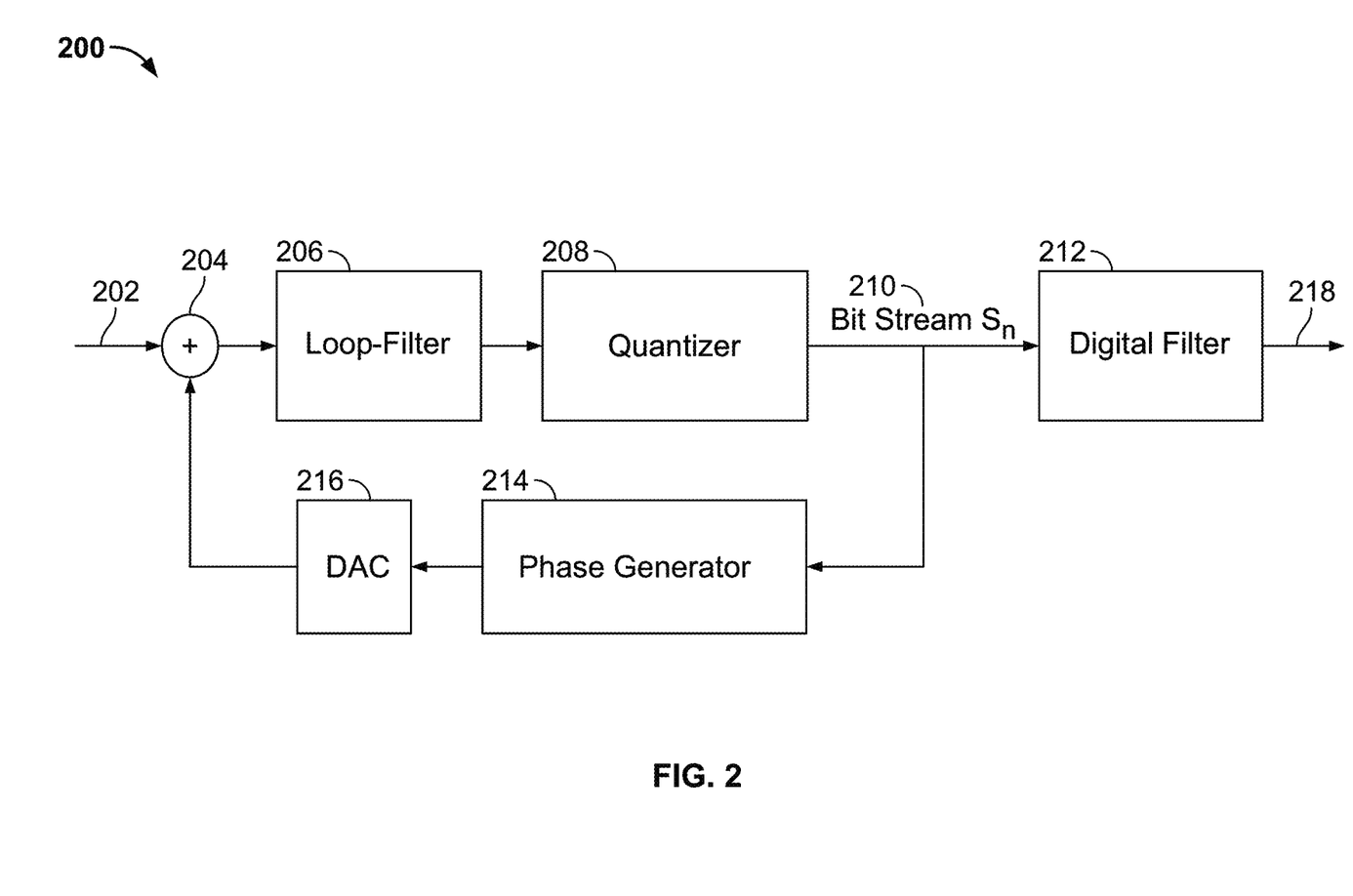
FIG. 2 shows an illustrative block diagram of sensor receive path in accordance with an embodiment of the present disclosure.

FIG. 2 shows an illustrative block diagram of a receive path of a sensor in accordance with an embodiment of the present disclosure. In the depicted embodiment, system 200 includes analog signal 202 (e.g., a capacitive input from an inertial sensor), adder 204, loop-filter 206, quantizer 208, bit stream ($S_n$) 210, digital filter 212, phase generator 214, digital-to-analog converter (DAC) 216, and digital output signal 218. Although particular components are depicted in certain configurations for system 200, components may be removed, modified, or substituted and additional components (e.g., converters, amplifiers, filters, processing circuitry, etc.) may be added in certain embodiments.

In some embodiments, analog signal 202 (e.g., a capacitive input signal) is received from a sensor such as a MEMS inertial sensor (e.g., a gyroscope, an accelerometer, a barometer, a magnetometer, etc.). In some embodiments, the inertial sensor may comprise a suspended spring-mass system, including a proof mass and a drive mass, which may be sized and configured in a manner to facilitate movement of the proof mass in response to movement of the drive mass and an external force, or excitation, to be measured, e.g., an angular velocity about an axis perpendicular to the drive axis. Drive circuitry (e.g., a phase-locked loop) may provide injected signals (e.g., drive signals) to the drive mass of the suspended spring-mass system via drive electrodes. A physical drive motion of one or more components (e.g., the drive mass) may result in a Coriolis force experienced by the proof mass when the inertial sensor is rotated with respect to an axis of interest. The proof mass is suspended over proof mass sense electrodes and, in response to the movement of the drive mass, rotates out-of-plane such that portions of the proof mass move closer to or farther away from (e.g., capacitively engage with) respective proof mass sense electrodes (e.g., with a degree of rotation based on the magnitude of the external force—angular velocity—and the motion imparted by the drive mass) to produce analog signal 202.

The analog sensor output (e.g., the capacitive output such as of a MEMS gyroscope) may, in many instances, not be subject to an external force. Under such conditions, the sensor output should have a fixed (e.g., zero) value. However, in some instances an Allan variance may be experienced even when the underlying sensor does not experience a force and is outputting a fixed or zero value. In an embodiment, adder 204 receives the analog signal 202 as well as an output signal of the digital-to-analog converter (DAC) 216 as a feedback signal representing a delayed and quantized version (e.g., an approximation) of the analog signal 202. The loop filter 206 features an extremely high gain at low frequency, hence the output of adder 204 is forced to be nearly zero in average (e.g., the difference between the analog signal 202 and the feedback signal is on average minimized); the feedback signal is such that its average is opposite to the average of analog signal 202, which, apart from a change in sign, explains why the average of bit stream ($S_n$) 210 is the same as analog signal 202. Out-of-average frequency components of bit stream ($S_n$) 210 are removed by digital filter 212, whose digital signal 218 is an accurate digital conversion of analog signal 202, provided that analog signal 202 varies slowly in comparison to bit stream ($S_n$) 210 rate.

In some embodiments, adder 204 combines analog signal 202 and the feedback output signal from DAC 216 and provides the output to loop-filter 206. Loop-filter 206 includes an integrator that may be susceptible to 1/f noise produced by the DAC 216, however, in some embodiments, loop-filter 206 implements a switching component (e.g., a chopper) to push 1/f noise (e.g., power spectral density over frequency) from the DAC 216 output signal at a high frequency. Loop-filter 206 outputs the filtered signal quantizer 208, which quantizes the received signal to a digital bit stream ($S_n$) 210, including a propagation delay, to digital filter 212 for output and/or further processing, and to phase generator 214 within a feedback path to adder 204.

Phase generator 214 receives bit stream ($S_n$) 210 from quantizer 208, and as described herein, provides a signal utilized by digital-to-analog converter ("DAC") DAC 216. The analog converted bit-stream is then fed back to adder 204 as an output signal of DAC 216 to complete the feedback network. Due to quantizer 208 logic, bit stream ($S_n$) 210 incorporates the propagation delay, which contributes to 1/f noise observed in the DAC 216 output signal and flicker noise observed in the digital output signal 218. Propagation delay sampled from quantizer 208 also affects phase generator 214, where internal delays are apparent, via misalignment of transition times, and are passed to DAC 216, ultimately resulting in a flicker noise that's reflected in digital (e.g., output) signal 218, due to the slow varying nature of flicker noise-induced delays.

Figure 3A:
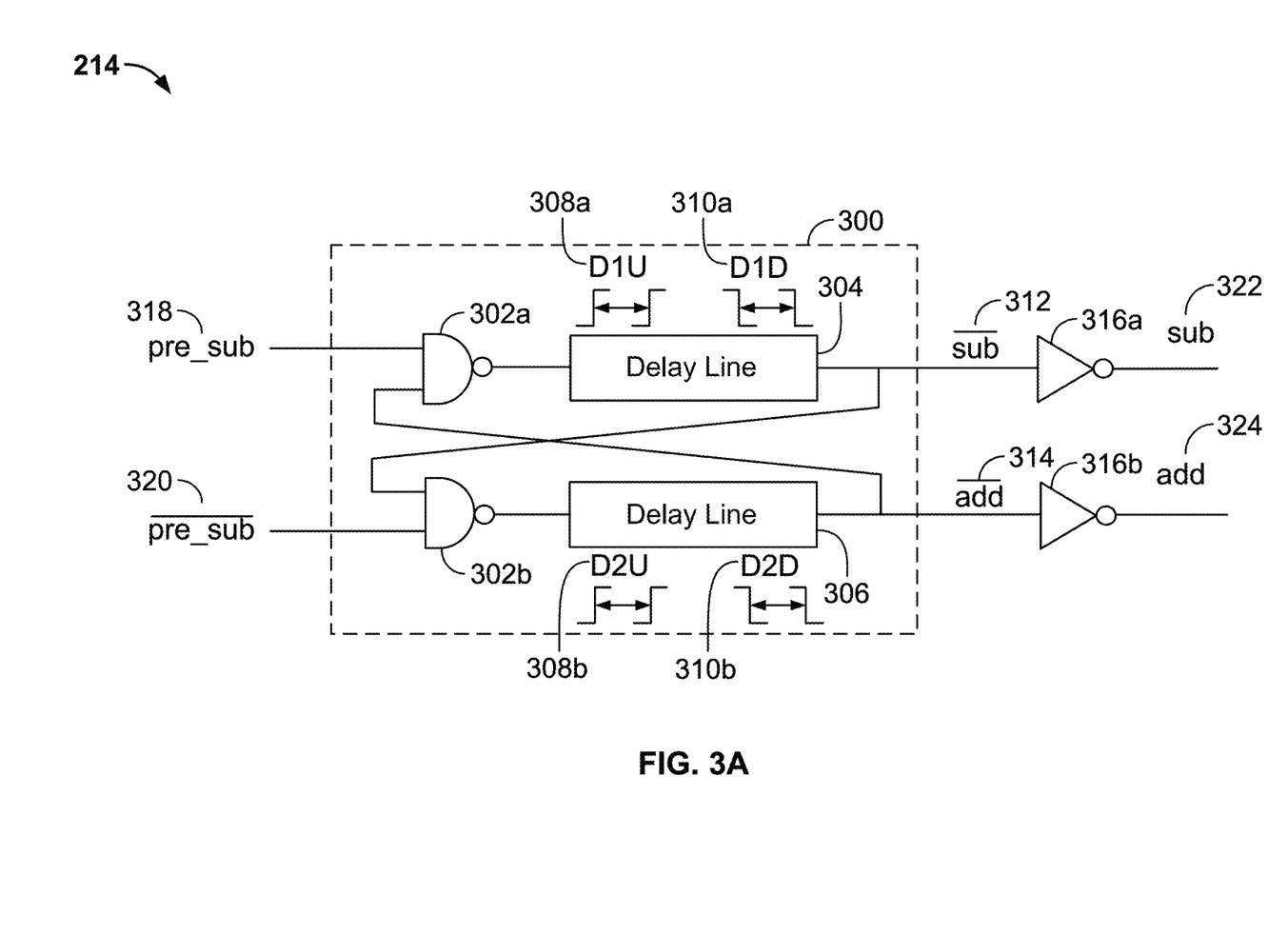
FIG. 3A shows an illustrative circuit diagram of a phase generator in accordance with an embodiment of the present disclosure.

FIG. 3A shows an illustrative circuit diagram of phase generator 214 in accordance with an embodiment of the present disclosure. In the depicted embodiment, phase generator 214 includes phase generation circuitry 300, which further includes NAND gates 302a, 302b, a first delay element 304, and a second delay element 306. Signal transition delays within the phase generation circuitry 300 are identified as rising edge delays (e.g., D1U 308a, D2U 308b), and falling edge delays (e.g., D1D 310a, D2D 310b). Phase generator 214 receives the digital bit stream ($S_n$), depicted as a first signal (e.g., $\overline{\text{pre\_sub}}$) 320, and an inverted version of the digital bit stream ($S_n$), depicted as a second signal (e.g., pre_sub) 318. The phase generation circuitry 300 outputs a third signal (e.g., $\overline{\text{add}}$) 314 and a fourth signal (e.g., $\overline{\text{sub}}$) 312, which in turn are provided to inverters 316a, 316b, which output inverted versions of the third and fourth signal as sub signal 322 and an add signal 324, respectively. Although particular components are depicted in certain configurations for phase generator 214, components may be removed, modified, or substituted and additional components (e.g., logic gates, inverters, delay elements, processing circuitry, etc.) may be added in certain embodiments.

Phase generation circuitry 300 includes two embedded delay lines that respectively include delays 308a and 308b for rising edges (e.g., D1U and D2U) and delays 310a and 310b for falling edges (e.g., D1D and D2D) of generated signals (e.g., a sub pulse 322 and an add pulse 324). It will be understood that the two delay lines over time flicker in an independent fashion (e.g., resulting in independent terms) although they are both affected by noise sources (e.g., propagation delay sampled from quantizer 208). For example, rising edge delays (e.g., D1U and D2U) as an average are the same but flicker around the average differently, and falling edge delays (e.g., D1D and D2D) as an average are the same but flicker around the average differently. DAC 216 of FIG. 2 receives an output from phase generation circuitry 300 (e.g., via inverters 316a and 316b) and outputs to adder 204 of FIG. 2 to complete the feedback loop of system 200 of FIG. 2. In some embodiments, DAC 216 may contribute to flicker noise (e.g., resulting in system 200 creating bias instability) applied to digital output signal 218 by converting digital signals to analog signals with a propagation delay (e.g., an uncertainty due to drift over time) corresponding to the propagation delay sampled from quantizer 208 by phase generation circuitry 300. The propagation delay within DAC 216 changes the average duty cycle from 50/50 to, e.g., 48/52, 45/55, 40/60, etc. because positive and negative pulses (e.g., sub and add pulses received from phase generation circuitry 300) of unequal durations independently flicker around a zero average value, in which case bit stream ($S_n$) 210 adjusts and incorporates the flicker noise to maintain the zero average value. Digital filter 212 receives bit stream ($S_n$) 210 from quantizer 208 and outputs digital output signal 218, which incorporates flicker noise from bit stream ($S_n$) 210 and produces bias instability observed in MEMS device operation.

Returning to FIG. 3A, phase generation circuitry 300 receives the first signal (e.g., $\overline{pre\_sub}$) 320 as a first input and the second signal (e.g., pre_sub) 318 as a second input from a quantizer (not depicted in FIG. 3A), where the first signal 320 is an inverted version of the second signal 318 and vice versa. In some embodiments, phase generation circuitry 300 samples the first signal (e.g., $\overline{pre\_sub}$) 320 and the second signal (e.g., pre_sub) 318 from the quantizer with a propagation delay (e.g., a delay affected by jitter) inherent to the received inputs and observable in the operation of the phase generation circuitry 300. NAND gate 302a receives the second signal (e.g., pre_sub) 318 as a first input and the output of the second delay element 306 as a second input, while NAND gate 302b receives the first signal (e.g., $\overline{pre\_sub}$) 320 as a first input and the output of the first delay element 304 as a second input. NAND gate 302a outputs to first delay element 304 to form a first delay line, and NAND gate 302b outputs to second delay element 306 to form a second delay line. The first delay line (e.g., including NAND gate 302a and first delay element 304) and the second delay line (e.g., including NAND gate 302b and second delay element 306) respectively include rising edge delays (e.g., D1U 308a and D2U 308b) and falling edge delays (e.g., D1D 310a and D2D 310b). Phase generation circuitry 300 outputs the third signal (e.g., $\overline{add}$) 314 to inverter 316b and the fourth signal (e.g., $\overline{sub}$) 312 to inverter 316a, which respectively output add signal 324 and sub signal 322 to external components. It will be understood that sub signal 322 (e.g., corresponding to the first delay line) and add signal 324 (e.g., corresponding to the second delay line) over time flicker in an independent fashion (e.g., resulting in independent terms) although they are both affected by noise sources (e.g., propagation delay sampled from the quantizer). For example, rising edge delay (e.g., D1U) 308a of sub signal 322 and rising edge delay (e.g., D2U) 308b of add signal 324 as an average may be the same value but may flicker around the average differently, and falling edge delay (e.g., D1D) 310a of sub signal 322 and falling edge delay (e.g., D2D) 310b of add signal 324 as an average may be the same value but may flicker around the average differently. The foregoing rising edge delay and falling edge delay variables are used to determine the duration of pulses of the sub signal 322 and the add signal 324 as described by equations (1) and (2) below:

$$\text{sub\_len} = T - D1D - D2U + D1U = T - D1D - (D2U - D1U) \quad (1)$$

$$\text{add\_len} = T - D2D - D1U + D2U = T - D2D + (D2U - D1U) \quad (2)$$

where:

$T$ = bit period $D1D$ = falling edge delay of sub signal 322

$D2D$ = falling edge delay of add signal 324

$D1U$ = rising edge delay of sub signal 322

$D2U$ = rising edge delay of add signal 324 sub_len = pulse duration of sub signal 322 add_len = pulse duration of add signal 324

Due to being based on independent rising and falling edge delays, sub_len pulse and add_len pulse over time have the same average value but flicker differently, which results in phase generator 214 generating bias instability.

Figure 3B:
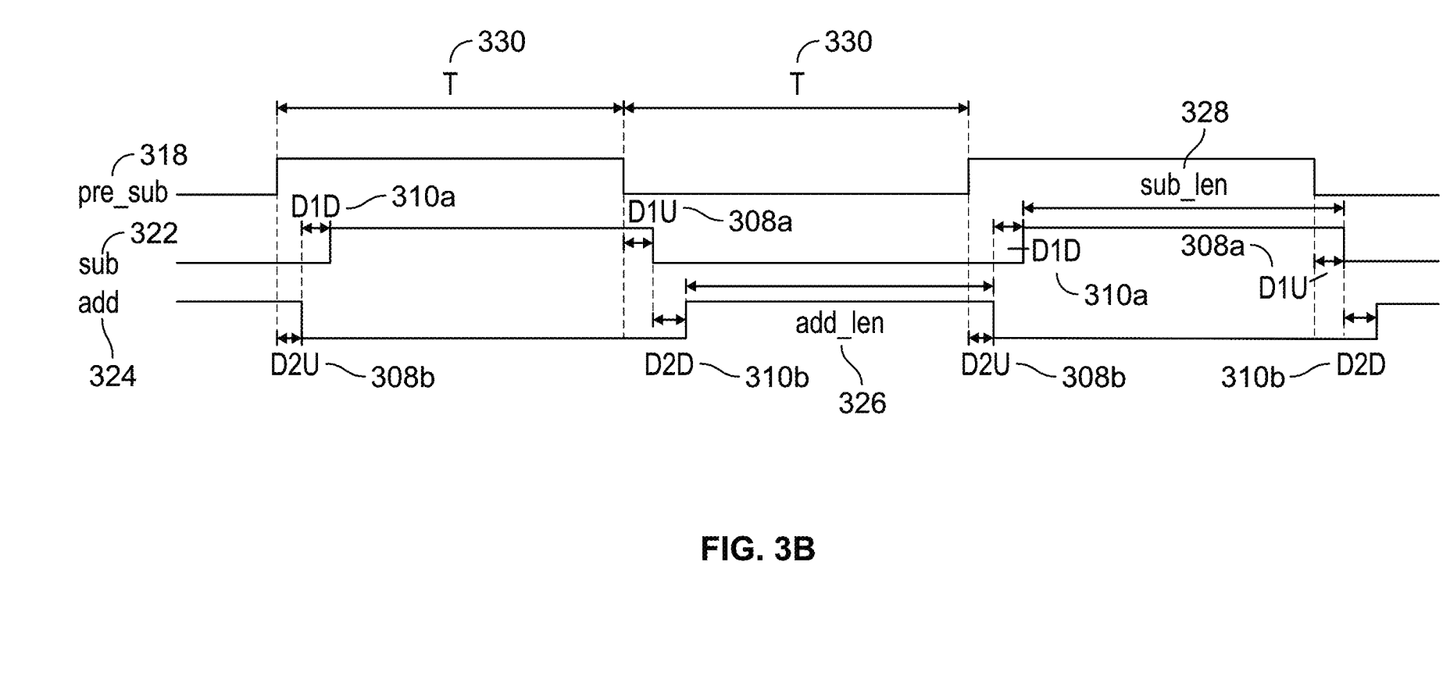
FIG. 3B shows an illustrative phase generator waveform in accordance with an embodiment of the present disclosure.

FIG. 3B shows an illustrative phase generator waveform in accordance with an embodiment of the present disclosure. D1D 310a represents the falling edge delay and D1U 308a represents the rising edge delay of sub signal 322 with respect to add signal 324, while D2D 310b represents the falling edge delay and D2U 308b represents the rising edge delay of add signal 324 with respect to sub signal 322. The misalignment of transition times between sub signal 322 and add signal 324, due to respective, independent rising edge delays (e.g., D1U 308a, D2U 308b) and falling edge delays (e.g., D1D 310a, D2D 310b), causes asymmetry between transitions (e.g., from zero to one or from one to zero) and results in flicker noise that contributes to bias instability. Flicker noise is a slow-varying noise source that may be described as a small drift of n-type and p-type metal-oxide-semiconductor (NMOS and PMOS) threshold voltages (e.g., $V_{tn}$ and $V_{tp}$) whose effect gets stronger for small size devices. In a logic gate, the small drift of switches translates into a slow modulation of propagation delay around its average value (e.g., sub signal 322 incorporating a falling edge delay (D1D 310a) and a rising edge delay (D1U 308a) and add signal 324 incorporating a falling edge delay (D2D 310b) and a rising edge delay (D2U 308b)). As depicted by equations (1) and (2) above, sub_len pulse 328 and add_len pulse 326 are determined by rising edge delays (e.g., D1U 308a, D2U 308b), falling edge delays (e.g., D1D 310a, D2D 310b), and a bit period (T) 330. Due to being based on independent rising and falling edge delays, sub_len pulse 328 and add_len pulse 326 as an average are the same but are independently modulated by flicker noise present in the feedback loop, which contributes to the generation of bias instability within the MEMS device. Delay asymmetry in the feedback loop, described by equation (3) below, also gets independently modulated by flicker noise, which results in slow-varying offset being translated to subsequent feedback components (e.g., DAC 216).

$$\text{asymmetry} = \text{sub\_len} - \text{add\_len} = 2*(D1U - D2U) - (D1D - D2D) \quad (3)$$

Second signal (e.g., pre_sub) 318 has a bit period (T) 330 and is used as a baseline within the phase generator waveform of FIG. 3B to convey delays in transition times with respect to sub signal 322 and add signal 324.

Figure 4:
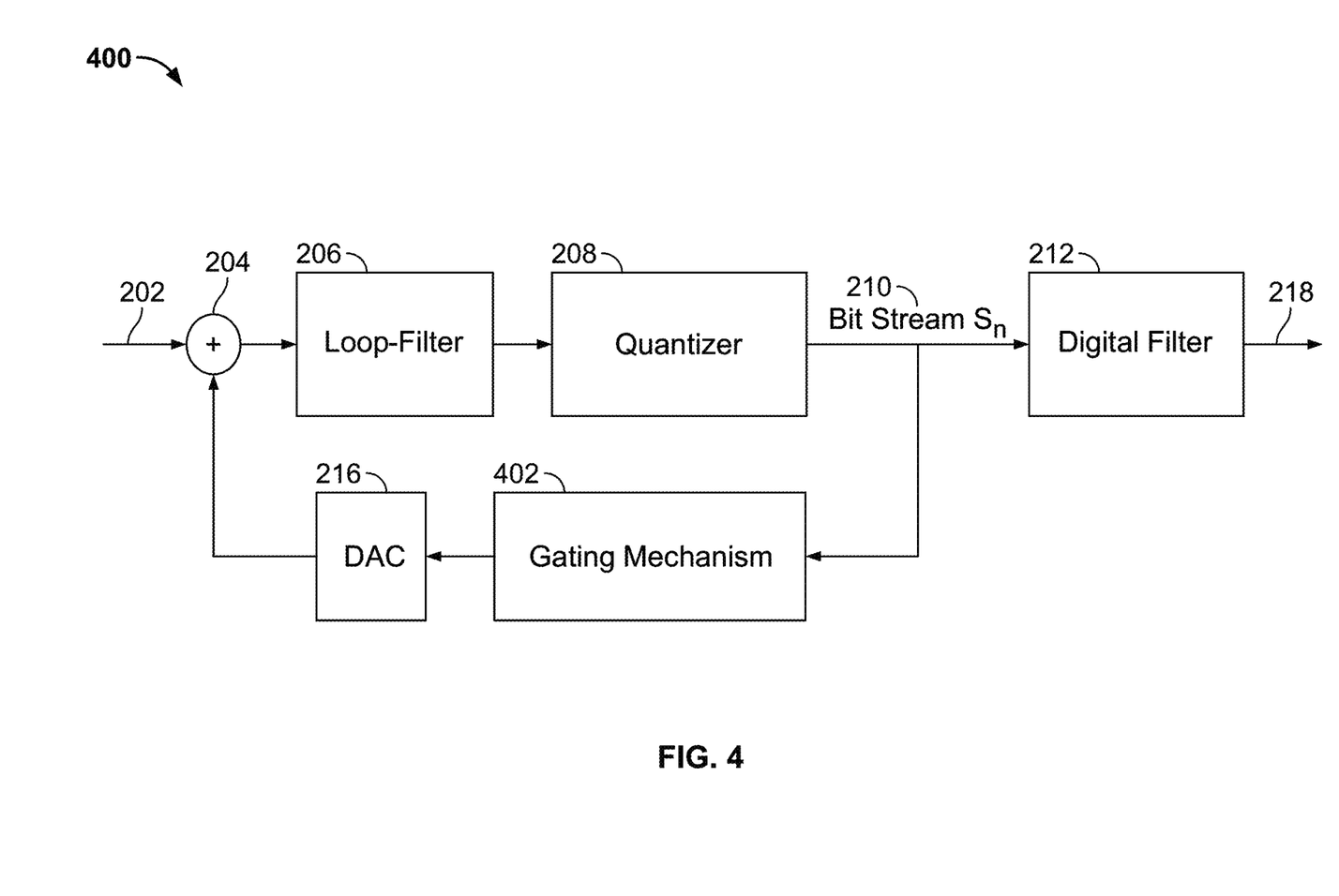
FIG. 4 shows an illustrative block diagram of a sensor receive path with a gating mechanism in accordance with an embodiment of the present disclosure.

FIG. 4 shows an illustrative block diagram of a sensor receive path with a gating mechanism in accordance with an embodiment of the present disclosure. In the depicted embodiment, sensor receive circuitry 400 includes analog signal 202, adder 204, loop-filter 206, quantizer 208, bit stream ($S_n$) 210, digital filter 212, DAC 216, and digital output signal 218 of system 200 as well as gating mechanism 402. Although particular components are depicted in certain configurations for sensor receive circuitry 400, components may be removed, modified, or substituted and additional components (e.g., converters, amplifier, filters, processing circuitry, etc.) may be added in certain embodiments.

Gating mechanism 402 samples bit stream ($S_n$) 210 from quantizer 208, which, in some embodiments, includes a propagation delay as a result of flicker noise produced by DAC 216 within the feedback loop of sensor receive circuitry 400. To combat flicker noise and ultimately bias instability generated by sensor receive circuitry 400, gating mechanism 402 overrides the propagation delay (e.g., the delay affected by jitter) sampled from quantizer 208 by generating a gating pulse, as described herein. Specifically, gating mechanism 402 receives bit stream ($S_n$) 210 at a first flip-flop, which produces a first signal (e.g., $\overline{S}_{n-1}$) and a second signal (e.g., $S_{n-1}$)—both of which serve as inputs to a phase generator (e.g., phase generator 214). A comparison block (e.g., including an inverter, a second flip-flop, and an XNOR gate) receives the first signal as a first input to the XNOR gate, receives a delayed first signal (e.g., $\overline{S}_{n-1.5}$), which passes through the second flip-flop, as a second input to the XNOR gate, and outputs a comparison block output signal (e.g., a pre_pulse signal). In some embodiments, the first signal and the delayed first signal received at the XNOR gate of the comparison block may be equal, in which case the comparison block output signal outputs a "0" value and passes through a gating pulse generator (e.g., including a delay element, an inverter, and a NOR gate) without delay. In some embodiments, the first signal and the delayed first signal received at the XNOR gate of the comparison block may be different, in which case the comparison block output signal outputs a "1" value and the gating pulse generator responds by creating a gating pulse. The gating pulse generator provides the comparison block output signal to the NOR gate as a first input, provides a delayed, inverted version of the comparison block output signal to the NOR gate as a second input, and produces a gating pulse, including a delay period (e.g., a common, or fixed, delay including feedback pulses exhibiting the same pulse width in both directions—low to high or high to low), that is fed to a gating stage (e.g., including two NOR gates). The gating pulse overrides any propagation delay (e.g., jitter) observed within the phase generator when a third signal (e.g., $\overline{add}$), based on the first signal (e.g., $\overline{S}_{n-1}$), and a fourth signal (e.g., $\overline{sub}$), based on the second signal (e.g., $S_{n-1}$), which the phase generator outputs to the gating stage, respectively transition between values such that DAC 216 doesn't receive a signal having flicker noise. It will be understood that reduction in flicker noise produced by logic gates and/or switches within the feedback path reduces Allan variance and allows smaller devices to be used for a particular noise level (e.g., smaller chip area). The gating stage receives the gating pulse and the third signal (e.g., $\overline{add}$) at a first NOR gate and further receives the gating pulse and the fourth signal (e.g., $\overline{sub}$) at a second NOR gate. As a result of the gating pulse implementing a transition gated delay that lasts longer than misaligned transition times of the third signal (e.g., $\overline{add}$) and the fourth signal (e.g., $\overline{sub}$), outputs of the gating stage (e.g., add_gate and sub_gate) do not reflect a delay (e.g., jitter) when being provided to DAC 216.

Figure 5:
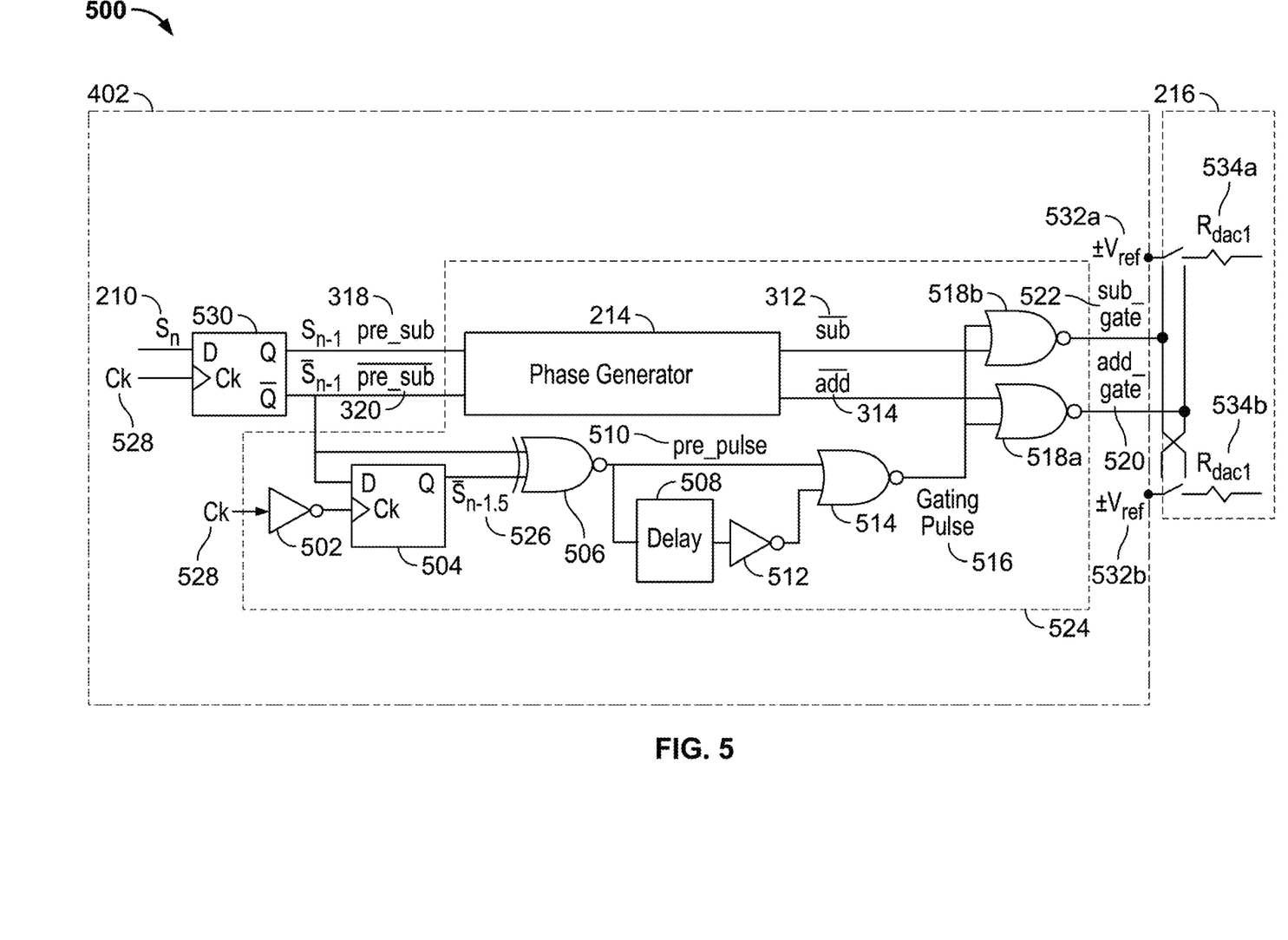
FIG. 5 shows an illustrative circuit diagram of a gating mechanism in accordance with an embodiment of the present disclosure.

FIG. 5 shows an illustrative circuit diagram of circuitry 500 including a gating mechanism in accordance with an embodiment of the present disclosure. In the depicted embodiment, the gating mechanism corresponds to gating mechanism 402 of sensor receive circuitry 400, includes a phase generator 214, digital-to-analog converter (DAC) 216, and bit stream ($S_n$) 210 of system 200, and first signal (e.g., $\overline{pre\_sub}$) 320, second signal (e.g., pre_sub) 318, third signal (e.g., $\overline{add}$) 314, and fourth signal (e.g., $\overline{sub}$) 312 of sensor receive circuitry 400. In addition, system 500 includes clock signal 528, flip-flop 530, inverter 502, flip-flop 504, delayed first signal (e.g., $\overline{S}_{n-1.5}$) 526, XNOR gate 506, delay element 508, comparison block output signal (e.g., pre_pulse) 510, inverter 512, NOR gate 514, gating pulse 516, NOR gates 518a, 518b, first gating stage output signal (e.g., add_gate) 520, second gating stage output signal (e.g., sub_gate) 522, voltage references ($V_{ref}$) 532a, 532b, and DAC resistors ($R_{dac1}$) 534a, 534b. Although particular components are depicted in certain configurations for the circuitry 500, components may be removed, modified, or substituted and additional components (e.g., logic gates, inverters, delay elements, processing circuitry, etc.) may be added in certain embodiments. For example, although particular logic components are depicted in FIG. 5 and elsewhere herein, similar logical operations may be accomplished using different combinations of such logic components.

Gating mechanism 402 samples bit stream ($S_n$) 210 from a quantizer (not visible), which, in some embodiments, includes a propagation delay (e.g., a delay affected by jitter) as a result of a presence of flicker noise within the feedback network. Flip-flop 530 receives bit stream ($S_n$) 210 and clock signal 528 as inputs and outputs the first signal (e.g., $\overline{pre\_sub}$) 320 and the second signal (e.g., pre_sub) 318 to phase generator 214, where first signal 320 is an inverted version of second signal 318 and vice versa. It will be understood that first signal 320 may be referred to as $\overline{S}_{n-1}$ and second signal 318 may be referred to as $S_{n-1}$ in the present disclosure. Flip-flop 530 additionally outputs first signal (e.g., $\overline{S}_{n-1}$) 320 to a comparison block (e.g., including inverter 502, flip-flop 504, and XNOR gate 506), where XNOR gate 506 receives the first signal (e.g., $\overline{S}_{n-1}$) 320 as a first input and a delayed first signal (e.g., $\overline{S}_{n-1.5}$) 526 as a second input. Flip-flop 504 receives an inverted clock signal 528 and the first signal (e.g., $\overline{S}_{n-1}$) 320 as inputs, where the inverted clock signal 528 delays the first signal 320 by half a clock cycle to produce delayed first signal (e.g., $\overline{S}_{n-1.5}$) 526. In some embodiments, the period of clock signal 528 may be less than or equal to an expected duration of changes in value of the first signal (e.g., $\overline{S}_{n-1}$) 320. XNOR gate 506 outputs a comparison block output signal (e.g., pre_pulse) 510 based on a comparison of the first signal (e.g., $\overline{S}_{n-1}$) 320 to the delayed first signal (e.g., $\overline{S}_{n-1.5}$) 526 (e.g., whether the first signal 320 transitions between a first value and a second value). In some embodiments, the first signal 320 and the delayed first signal 526 may be equal in phase (e.g., exhibiting no propagation delay), in which case the comparison block output signal (e.g., pre_pulse) 510 has a "0" value and passes through a gating pulse generator (e.g., including delay element 508, inverter 512, and NOR gate 514) without delay. In some embodiments, the first signal 320 and the delayed first signal 526 may differ in phase (e.g., exhibiting propagation delay), in which case the comparison block output signal (e.g., pre_pulse) 510 has a "1" value and the gating pulse generator consequently creates a gating pulse 516.

NOR gate 514 receives the comparison block output signal (e.g., pre_pulse) 510 as a first input and a delayed, inverted version of the comparison block output signal 510 as a second input, where the delayed, inverted version of the comparison block output signal 510 passes through delay element 508 and inverter 512 before reaching NOR gate 514. NOR gate 514 produces a gating pulse 516 with a delay period (e.g., a common delay including symmetrical rising and falling edge delays) and delivers the gating pulse 516 to a gating stage (e.g., including NOR gates 518a, 518b). NOR gate 518a receives the gating pulse 516 from the gating pulse generator and the third signal (e.g., $\overline{add}$) 314 from phase generator 214, and NOR gate 518b receives the gating pulse 516 from the gating pulse generator and the fourth signal (e.g., $\overline{sub}$) 312 from phase generator 214. It will be understood that the gating stage delays each of the third signal (e.g., $\overline{add}$) 314 and the fourth signal (e.g., $\overline{sub}$) 312 by the delay period (e.g., the common, or fixed, delay) of the gating pulse 516. The delay period of the gating pulse 516 overrides respective rising edge delays (e.g., D1U 308a, D2U 308b) and falling edge delays (e.g., D1D 310a, D2D 310b) of the third signal (e.g., $\overline{add}$) 314 and the fourth signal (e.g., sub) 312 (e.g., asymmetrical feedback signal transitions) to prevent asymmetric delays (e.g., jitter) from reaching DAC 216, via first and second gating stage output signals (e.g., add_gate 520 and sub_gate 522), and contributing to the generation of flicker noise (e.g., a source of bias instability) within the feedback network. In some embodiments, a transition of the third signal (e.g., $\overline{add}$) 314 from, e.g., a third value to a fourth value may be based on a transition of the first signal (e.g., $\overline{S}_{n-1}$) 320, and a transition of the fourth signal (e.g., $\overline{sub}$) 312 from, e.g., a fifth value to a sixth value may be based on a transition of the second signal (e.g., $S_{n-1}$) 318. In some embodiments, the duration of the delay period of the gating pulse 516 may be two times greater than maximum internal delays of the phase generator 214 particular to the third signal (e.g., $\overline{add}$) 314 and the fourth signal (e.g., $\overline{sub}$) 312. It will be understood that the gating pulse 516 delay period may be any number of times greater than maximum internal delays of the phase generator 214 to prevent propagation delay from reaching subsequent feedback components (e.g., DAC 216). The gating stage (e.g., including NOR gates 518a, 518b) respectively outputs add_gate 520 and sub_gate 522 to DAC 216, which may be activated by respective voltage references ($V_{ref}$) 532a, 532b actuating a voltage drop across DAC 216 via DAC resistors ($R_{dac1}$) 534a, 534b. Boundary 524 corresponds to the generation and application of gating pulse 516 to the gating stage (e.g., including NOR gates 518a, 518b).

Figure 6:
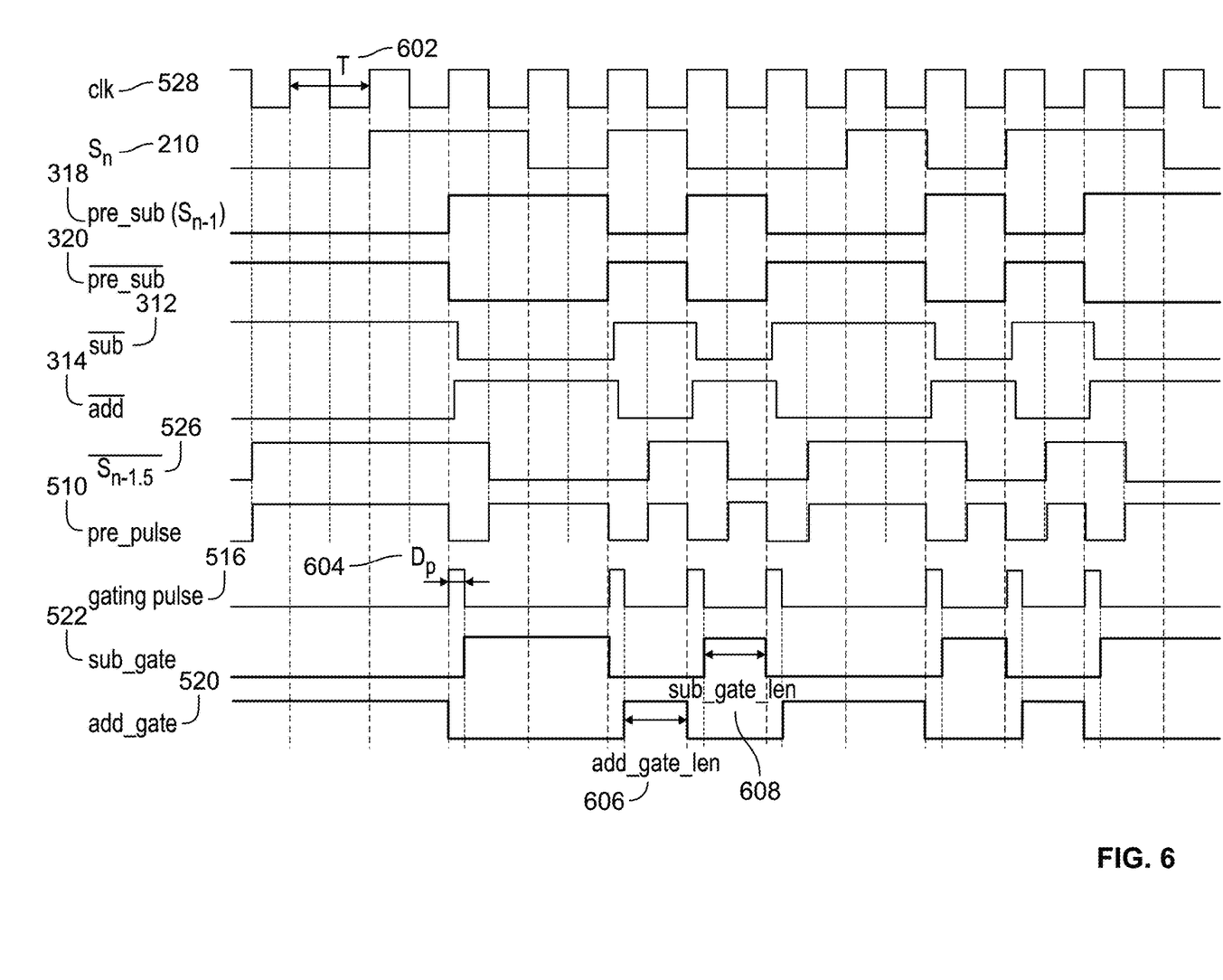
FIG. 6 shows an illustrative gating mechanism waveform in accordance with an embodiment of the present disclosure.

FIG. 6 shows an illustrative gating mechanism waveform in accordance with an embodiment of the present disclosure. Clock signal 528 has a bit period (T) 602 that is used to determine sub_gate_len pulse 608 (e.g., corresponding to sub_gate 522) and add_gate_len pulse 606 (e.g., corresponding to add_gate 520), as described by equations (4) and (5) below:

$$\text{sub\_gate\_len} = T - D_p \quad (4)$$

$$\text{add\_gate\_len} = T - D_p \quad (5)$$

where:

$T$ = bit period of clock signal 528

$D_p$ = delay period of gating pulse 516 sub_gate_len = pulse duration of sub_gate 522 add_gate_len = pulse duration of add_gate 520

As described above, the delay period (e.g., the common, or fixed, delay) ($D_P$) 604 of gating pulse 516 overrides respective rising edge delays (e.g., D1U 308a, D2U 308b of FIG. 3B) and falling edge delays (e.g., D1D 310a, D2D 310b of FIG. 3B) of the third signal (e.g., $\overline{add}$) 314 and the fourth signal (e.g., $\overline{sub}$) 312 to prevent propagation delay (e.g., delay affected by jitter) from reaching subsequent feedback components (e.g., DAC 216), via first and second gating stage output signals (e.g., add_gate 520 and sub_gate 522), and contributing to the generation of flicker noise (e.g., a source of bias instability) within the feedback network. In some embodiments, delay period ($D_P$) 604 and bit period (T) 602 may vary slowly over time, in which case delay asymmetry is negligible and no slow-varying offset is translated to subsequent feedback components (e.g., DAC 216). It will be understood that even though delay period ($D_P$) 604 is affected by flicker noise, the propagation delay does not translate into asymmetry with the implementation of system 500.

Figure 7:
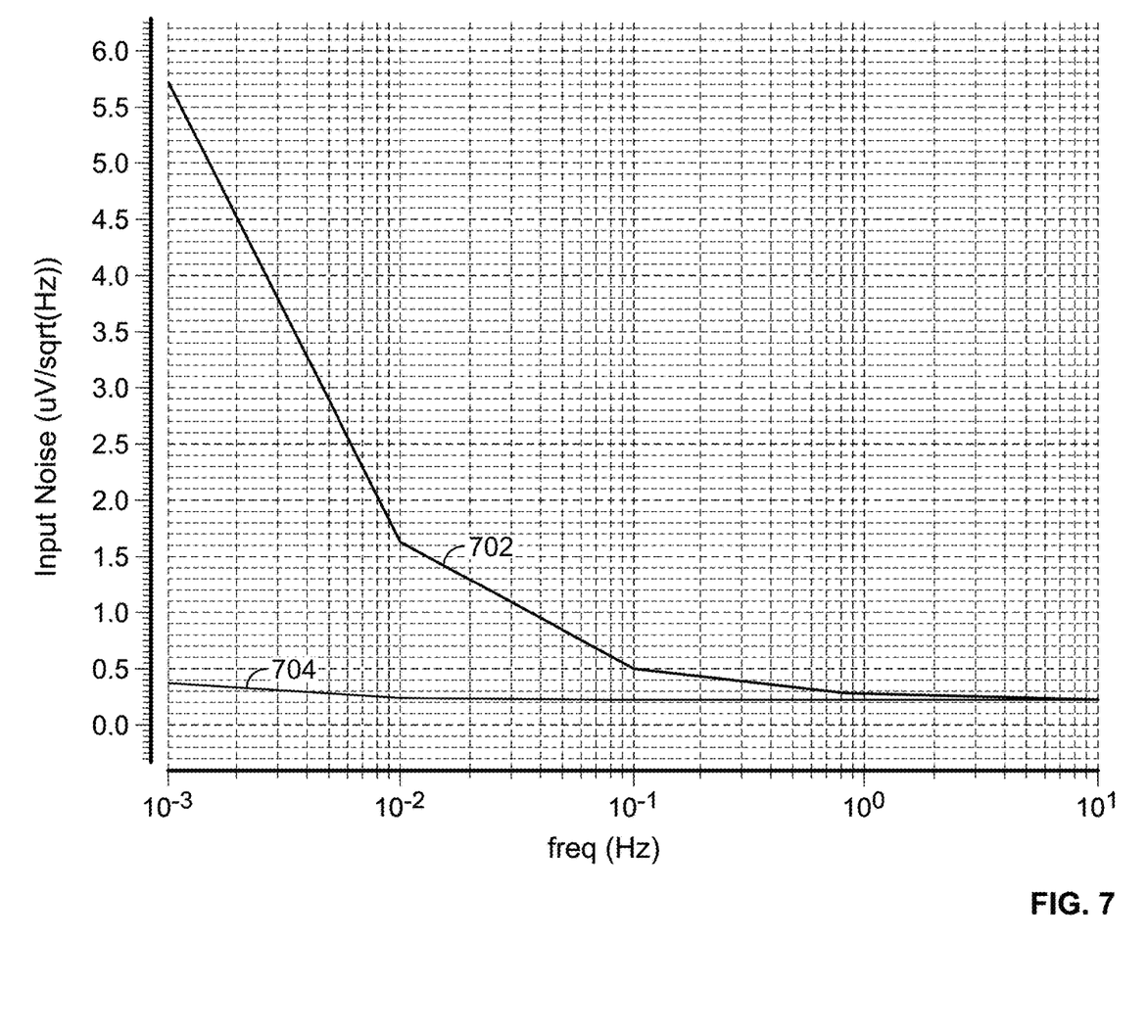
FIG. 7 shows an illustrative diagram depicting an equivalent input noise spectrum of a MEMS device with the implementation of a gating mechanism and without the implementation of a gating mechanism in accordance with an embodiment of the present disclosure.

FIG. 7 shows an illustrative diagram depicting an equivalent input noise spectrum of a MEMS device with the implementation of a gating mechanism and without the implementation of a gating mechanism in accordance with an embodiment of the present disclosure. FIG. 7 includes two plots (e.g., a feedback system without a gating mechanism—plot 702, and a feedback system with a gating mechanism—plot 704) of power spectral density of noise, with respect to frequency, at the sensor receive path (e.g., analog signal 202). Plot 702 (e.g., a feedback system without a gating mechanism) displays how the power spectral density at analog (e.g., input) signal 202 increases as plot 702 approaches zero (e.g., due to the 1/f relationship). Contrarily, as plot 704 (e.g., a feedback system with a gating mechanism) approaches zero, flicker noise, and accordingly bias instability within the MEMS device, is significantly reduced. It will be understood that the power spectral density of plot 704 is non-zero because NOR gates 518a, 518b of the gating stage in FIG. 5 flicker due to each gate adding their own independent delay to system 500. Each propagation delay of NOR gates 518a, 518b is respectively one order of magnitude less than the delay measured at delay element 508 of the gating pulse generator of FIG. 5. Accordingly, the power spectral density of plot 704 is measured to approximately be one order of magnitude less than the power spectral density of plot 702 at 0.01 Hz (e.g., plot 704 approximately equals 0.4 µV/sqrt(Hz) and plot 702 approximately equals 5.75 µV/sqrt(Hz)).

Figure 8:
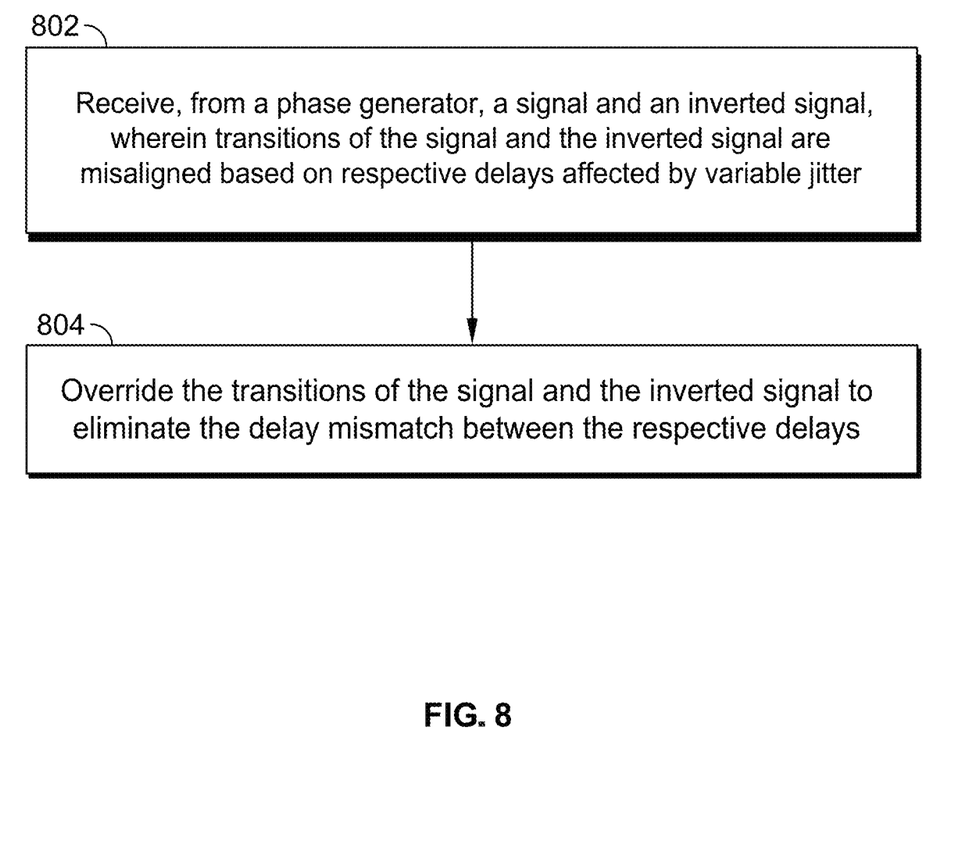
FIG. 8 shows an illustrative flowchart for reducing variable delay mismatch owing to jitter in accordance with an embodiment of the present disclosure.

FIG. 8 shows an illustrative flowchart for reducing variable delay mismatch owing to jitter in accordance with an embodiment of the present disclosure. Although particular steps are depicted in certain configurations for FIG. 8, steps may be removed, modified, or substituted and additional steps may be added in certain embodiments. At step 802, processing circuitry receives, from a phase generator (e.g., phase generator 214), a signal (e.g., third signal ($\overline{add}$) 314) and an inverted signal (e.g., fourth signal ($\overline{sub}$) 312), wherein transitions of the signal (e.g., third signal ($\overline{add}$) 314) and the inverted signal (e.g., fourth signal ($\overline{sub}$) 312) are misaligned based on a delay affected by jitter. In some embodiments, the delay affected by jitter may be conveyed by rising edge delays (e.g., D1U 308a, D2U 308b) and falling edge delays (e.g., D1D 310a, D2D 310b) observable in the signal (e.g., third signal ($\overline{add}$) 314) and the inverted signal (e.g., fourth signal ($\overline{sub}$) 312) outputted by the phase generator (e.g., phase generator 214). It will be understood that the delay affected by jitter causes asymmetry between the transitions of the signal (e.g., third signal ($\overline{add}$) 314) and the inverted signal (e.g., fourth signal ($\overline{sub}$) 312) from a high value to a low value or vice versa, which contributes to flicker noise (e.g., a source of bias instability) within the feedback network of, e.g., sensor receive circuitry 400.

At step 804, processing circuitry overrides the transitions of the signal (e.g., third signal ($\overline{add}$) 314) and the inverted signal (e.g., fourth signal ($\overline{sub}$) 312) to eliminate the delay mismatch affected by jitter. In some embodiments, overriding the transitions of the signal (e.g., third signal ($\overline{add}$) 314) and the inverted signal (e.g., fourth signal ($\overline{sub}$) 312) includes applying, via a gating pulse (e.g., gating pulse 516), a fixed delay (e.g., a common delay including symmetrical rising and falling edge delays) to each of the signal (e.g., third signal ($\overline{add}$) 314) and the inverted signal (e.g., fourth signal ($\overline{sub}$) 312) at a gating stage (e.g., including NOR gates 518a, 518b). The fixed delay lasts longer than the delay affected by jitter such that the delay affected by jitter is not propagated to subsequent feedback components (e.g., DAC 216) and, accordingly, flicker noise within the feedback network is minimized.

Figure 9:
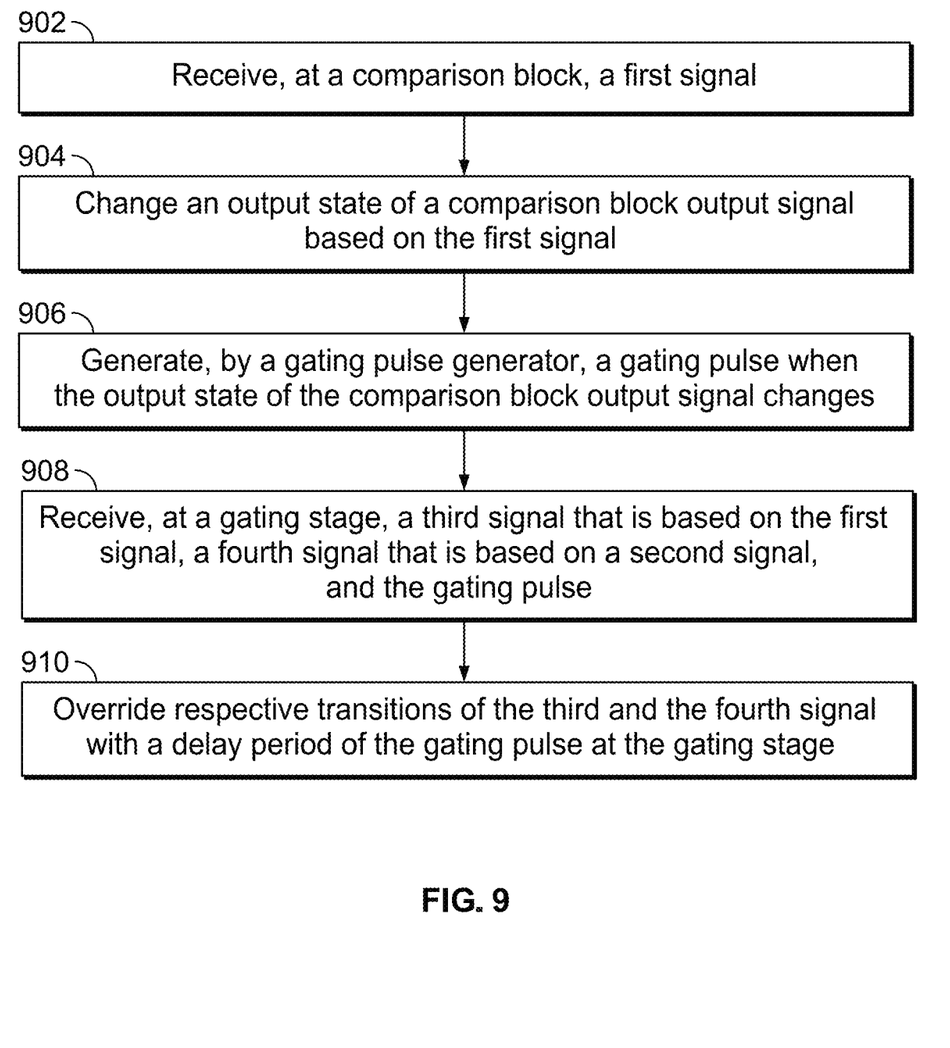
FIG. 9 shows an illustrative flowchart for removing flicker noise impact via a gating mechanism apart of a feedback network in accordance with an embodiment of the present disclosure.

FIG. 9 shows an illustrative flowchart for removing flicker noise impact via a gating mechanism apart of a feedback network in accordance with an embodiment of the present disclosure. Although particular steps are depicted in certain configurations for FIG. 9, steps may be removed, modified, or substituted and additional steps may be added in certain embodiments. At step 902, processing circuitry receives, at a comparison block (e.g., including inverter 502, flip-flop 504, and XNOR gate 506), a first signal (e.g., $\overline{S}_{n-1}$ 320). XNOR gate 506 receives the first signal (e.g., $\overline{S}_{n-1}$ 320) as a first input and a delayed first signal (e.g., $\overline{S}_{n-1.5}$ 526) as a second input. Flip-flop 504 receives an inverted clock signal (e.g., clock signal 528) and the first signal (e.g., $\overline{S}_{n-1}$ 320) as inputs, where the inverted clock signal (e.g., clock signal 528) delays the first signal (e.g., $\overline{S}_{n-1}$ 320) by half a clock cycle to produce the delayed first signal (e.g., $\overline{S}_{n-1.5}$ 526).

At step 904, processing circuitry changes an output state of a comparison block output signal based on the first signal (e.g., $\overline{S}_{n-1}$ 320). Specifically, XNOR gate 506 outputs a comparison block output signal (e.g., pre_pulse 510) based on a comparison of the first signal (e.g., $\overline{S}_{n-1}$ 320) to the delayed first signal (e.g., $\overline{S}_{n-1.5}$ 526). In some embodiments, the first signal (e.g., $\overline{S}_{n-1}$ 320) and the delayed first signal (e.g., $\overline{S}_{n-1.5}$ 526) may be equal in phase (e.g., exhibiting no propagation delay), in which case the comparison block output signal (e.g., pre_pulse 510) has a "0" value and passes through a gating pulse generator without delay. In some embodiments, the first signal (e.g., $\overline{S}_{n-1}$ 320) and the delayed first signal (e.g., $\overline{S}_{n-1.5}$ 526) may differ in phase (e.g., exhibiting propagation delay), in which case the comparison block output signal (e.g., pre_pulse 510) has a "1" value.

In response to the comparison block output signal (e.g., pre_pulse 510) having a "1" value, at step 906, processing circuitry generates, by the gating pulse generator (e.g., including delay element 508, inverter 512, and NOR gate 514), a gating pulse (e.g., gating pulse 516). NOR gate 514 receives the comparison block output signal (e.g., pre_pulse 510) as a first input and a delayed, inverted version of the comparison block output signal as a second input, where the delayed, inverted version of the comparison block output signal passes through delay element 508 and inverter 512 before reaching NOR gate 514. NOR gate 514 produces the gating pulse (e.g., gating pulse 516) with a delay period (e.g., a common delay that includes symmetrical rising and falling edge delays) and delivers the gating pulse to a gating stage.

At step 908, processing circuitry receives, at the gating stage (e.g., including NOR gates 518a, 518b), a third signal (e.g., $\overline{add}$ 314) that is based on the first signal (e.g., $\overline{S}_{n-1}$ 320), a fourth signal (e.g., $\overline{sub}$ 312) that is based on a second signal (e.g., $S_{n-1}$ 318), and the gating pulse (e.g., gating pulse 516). It will be understood that a phase generator (e.g., phase generator 214) delivers the third signal (e.g., $\overline{add}$ 314) to NOR gate 518a and the fourth signal (e.g., $\overline{sub}$ 312) to NOR gate 518b.

At step 910, processing circuitry overrides respective transitions of the third signal (e.g., $\overline{add}$ 314) and the fourth signal (e.g., $\overline{sub}$ 312) with the delay period of the gating pulse (e.g., gating pulse 516) at the gating stage (e.g., including NOR gates 518a, 518b). The delay period of the gating pulse (e.g., gating pulse 516) overrides respective rising edge delays (e.g., D1U 308a, D2U 308b) and falling edge delays (e.g., D1D 310a, D2D 310b) of the third signal (e.g., $\overline{add}$ 314) and the fourth signal (e.g., $\overline{sub}$ 312) to prevent propagation delay (e.g., jitter) from reaching subsequent feedback components (e.g., DAC 216), via gating stage output signals (e.g., add_gate 520 and sub_gate 522), and contributing to the generation of flicker noise (e.g., a source of bias instability) within the feedback network. In some embodiments, the duration of the delay period of the gating pulse (e.g., gating pulse 516) may be two times greater than maximum internal delays of the phase generator (e.g., phase generator 214) particular to the third signal (e.g., $\overline{add}$ 314) and the fourth signal (e.g., $\overline{sub}$ 312).

The foregoing description includes exemplary embodiments in accordance with the present disclosure. These examples are provided for purposes of illustration only, and not for purposes of limitation. It will be understood that the present disclosure may be implemented in forms different from those explicitly described and depicted herein and that various modifications, optimizations, and variations may be implemented by a person of ordinary skill in the present art, consistent with the following claims.

What is claimed is:

1. A circuit for reducing flicker noise in a sensor signal path, comprising:
    a comparison block coupled to receive a first signal within the sensor signal path and to change an output state of a comparison block output signal based on whether the first signal is transitioning between a first value and a second value;
    a gating pulse generator coupled to receive the comparison block output signal, wherein a gating pulse having a delay period is output from the gating pulse generator when the output state of the comparison block output signal changes; and
    a gating stage, wherein a second signal is an inverted version of the first signal, wherein the gating stage receives the gating pulse, a third signal that is based on the first signal, and a fourth signal that is based on the second signal, and wherein a transition of the third signal from a third value to a fourth value and a transition of the fourth signal from a fifth value to a sixth value are delayed based on the delay period of the gating pulse.

2. The circuit of claim 1, wherein each of the first value, the second value, the third value, the fourth value, the fifth value, and the sixth value is a binary value.

3. The circuit of claim 2, wherein an original transition of the third signal from the third value to the fourth value is based on the transition of the first signal, wherein the original transition of the third signal is delayed based on a delay affected by jitter, and wherein an original transition of the fourth signal from the fifth value to the sixth value is based on a transition of the second signal, and wherein the original transition of the fourth signal is delayed based on a delay affected by jitter.

4. The circuit of claim 3, wherein the delay period of the gating pulse is greater than a maximum value for the delays affected by jitter, such that the delay period overrides the original transition of the third signal and the original transition of the fourth signal.

5. The circuit of claim 4, wherein the delay period is two times greater than the maximum value for the delays affected by jitter.

6. The circuit of claim 1, wherein the output state of the comparison block output signal changes when the first signal transitions between the first value and the second value.

7. The circuit of claim 6, wherein the comparison block receives a clock signal, and wherein the comparison block output signal changes back to its previous output state based on a next transition of the clock signal after the transition of the first signal between the first value and the second value.

8. The circuit of claim 7, wherein a period of the clock signal is shorter than or equal to an expected duration of changes in value of the first signal.

9. The circuit of claim 1, wherein the gating pulse generator comprises a logic gate and a delay element, wherein a first input to the logic gate comprises the comparison block output signal, and wherein a second input to the logic gate comprises a delayed version of the comparison block output signal via the delay element, wherein the delayed version of the comparison block output signal is delayed by the delay period.

10. The circuit of claim 9, wherein the gating pulse is output for a duration of the delay period from when the output state of the comparison block output signal changes.

11. The circuit of claim 10, wherein the logic gate comprises a NOR gate.

12. The circuit of claim 11, wherein the delayed version of the comparison block output signal is inverted prior to being provided as the second input to the logic gate.

13. The circuit of claim 1, wherein the gating stage delays each of the transitions of the third signal and the fourth signal based on the delay period.

14. The circuit of claim 13, wherein the gating stage comprises a first logic gate that receives the third signal and the gating pulse as inputs, and a second logic gate that receives the fourth signal and the gating pulse as inputs.

15. The circuit of claim 14, wherein each of the first logic gate and the second logic gate is a NOR gate.

16. The circuit of claim 1, further comprising a phase generator, wherein the first and the second signals are inputs to the phase generator, and wherein the third and the fourth signals are outputs from the phase generator.

17. The circuit of claim 16, wherein a delay affected by jitter is based on a misalignment of transition times between the third signal and the fourth signal within the phase generator.

18. A method for reducing delay mismatch owing to jitter, comprising:
receiving, from a phase generator, a signal and an inverted signal, wherein transitions of the signal and the inverted signal are misaligned based on respective delays affected by jitter; and
overriding the transitions of the signal and the inverted signal to eliminate the delay mismatch between the respective delays.

19. The method of claim 18, wherein overriding the transitions of the signal and the inverted signal comprises applying a fixed delay to each of the signal and the inverted signal.

20. The method of claim 19, further comprising:
receiving, at a gating stage, the signal, the inverted signal, and the fixed delay; and
applying, by the gating stage, the fixed delay to each of the signal and the inverted signal to override the transitions of the signal and the inverted signal.

* * * * *

UNITED STATES PATENT AND TRADEMARK OFFICE
CERTIFICATE OF CORRECTION

PATENT NO. : 12,199,629 B2
APPLICATION NO. : 18/107219
DATED : January 14, 2025
INVENTOR(S) : Omid Oliaei et al.

Page 1 of 1

It is certified that error appears in the above-identified patent and that said Letters Patent is hereby corrected as shown below:

On the Title Page

In Column 1, Line 3, item (54), in title, and in the Specification Column 1, Line 3, delete "ADCS PRELIMINARY CLASS" and insert -- ADCS --, therefor.

Signed and Sealed this
First Day of April, 2025

Coke Morgan Stewart
*Acting Director of the United States Patent and Trademark Office*